United States Patent [19]
Negishi

[11] Patent Number: 6,099,640
[45] Date of Patent: Aug. 8, 2000

[54] MOLECULAR BEAM EPITAXIAL GROWTH METHOD

[75] Inventor: Hitoshi Negishi, Tokyo, Japan

[73] Assignee: NEC Corporation, Tokyo, Japan

[21] Appl. No.: 09/146,102

[22] Filed: Sep. 3, 1998

[30] Foreign Application Priority Data

Sep. 3, 1997 [JP] Japan ................................. 9-238157

[51] Int. Cl.⁷ .............................................. C30B 23/06
[52] U.S. Cl. ..................... 117/105; 117/107; 117/108; 117/953; 117/954
[58] Field of Search ................................ 117/953, 954, 117/105, 108, 107

[56] References Cited

U.S. PATENT DOCUMENTS 5,400,739  3/1995  Kao et al. .................................. 117/86
5,490,880  2/1996  Kao et al. .................................. 118/665
5,625,204  4/1997  Kao et al. .................................. 257/190

FOREIGN PATENT DOCUMENTS 61-91097   5/1986  Japan .
4-25120    1/1992  Japan .
5-347245  12/1993  Japan .
6-140332   5/1994  Japan .
7-82093    3/1995  Japan .

OTHER PUBLICATIONS

Jackson et al., "Monitoring Ga and In desorption and In surface segregation during MBE using atomic adsorption", Journal of Crystal Growth, vol. 175/176 pp. 244–249, 1997.

*Primary Examiner*—Robert Kunemund
*Attorney, Agent, or Firm*—Young & Thompson

[57] ABSTRACT

A method of promoting evaporation of excess indium from a surface of an indium containing compound semiconductor single crystal layer during a discontinuation of a molecular beam epitaxial growth. Substantial supply of all elements for the indium containing compound semiconductor single crystal layer are stopped at least until a substrate temperature rises to a predetermined temperature of not less than an indium re-evaporation initiation temperature.

43 Claims, 9 Drawing Sheets

MOLECULAR BEAM EPITAXIAL GROWTH METHOD

BACKGROUP OF THE INVENTION

The present invention relates to a molecular beam epitaxial growth method for growing a plurality of compound semiconductor single crystal layers on a semiconductor substrate, and more particularly to a method of improving an interface of an InGaAs layer or an InAlAs layer on a molecular beam epitaxial growth for forming a compound semiconductor single crystal multilayer structure.

In recent years, the requirement for improvement in high frequency performances of semiconductor devices such as a group III–V based compound semiconductor Schottky gate field effect transistor such as a GaAs-based compound semiconductor Schottky gate field effect transistor has been on the increase. Particularly, a low noise compound semiconductor field effect transistor utilizes a two-dimensional electron gas formed in a channel layer and in the vicinity of a hetero-interface between the channel layer and an electron donor layer. Characteristics of such the low noise compound semiconductor field effect transistors are likely to depend upon both a flatness and an abruptness of the hetero-interface thereof. A high current gain cut-off frequency (fT) is essential for improvement in the characteristics of such the low noise compound semiconductor field effect transistors. The current gain cut-off frequency (fT) is defined by the following equation (1).

$$fT = gm/(2\pi \times C_{gs}) \quad (1)$$

where gm is the conductance, and $C_{gs}$ is the gate-source capacitance.

In order to rise the current gain cut-off frequency (fT), it is required to increase the conductance (gm). In order to increase the conductance (gm), it is required to increase an electron mobility and a sheet carrier concentration of the two-dimensional electron gas.

In Japanese laid-open patent publication No. 7-82093, it is disclosed that a segregation of indium on an AlGaAs/InGaAs hetero-interface is controlled to obtain an abruptness of the AlGaAs/InGaAs hetero-interface, whereby the electron mobility of the two-dimensional electron gas is increased. This will be described in more detail with reference to FIG. 1 which is a fragmentary cross sectional elevation view illustrative of an epitaxial wafer for a low noise compound semiconductor field effect transistor formed in the conventional molecular beam epitaxial growth method. The epitaxial wafer comprises a GaAs substrate 31, an undoped GaAs buffer layer 32 on the GaAs substrate 31, an undoped $In_{0.15}Ga_{0.85}As$ channel layer 33 on the undoped GaAs buffer layer 32, an undoped $Al_{0.24}Ga_{0.76}As$ spacer layer 34 on the undoped $In_{0.15}Ga_{0.85}As$ channel layer 33, an Si-doped $Al_{0.24}Ga_{0.76}As$ electron donor layer 35 on the undoped $Al_{0.24}Ga_{0.76}As$ spacer layer 34, and an Si-doped GaAs cap layer 36 on the Si-doped $Al_{0.24}Ga_{0.76}As$ electron donor layer 35. This epitaxial wafer is formed as follows.

A surface of the GaAs substrate 31 is subjected to a cleaning process at a temperature of 640° C. for 15 minutes for subsequent molecular beam epitaxial growth processes. The undoped GaAs buffer layer 32 having a thickness of 0.5 micrometers is grown on the GaAs substrate 31 by a first molecular beam epitaxial growth at a substrate temperature of 600° C. The substrate temperature is dropped to 530° C. for a second molecular beam epitaxial growth of the undoped $In_{0.15}Ga_{0.85}As$ channel layer 33 having a thickness of 18 nanometers on the undoped GaAs buffer layer 32. Thereafter, the supplies of In and Ga are discontinued while the supply of As remains continued, during which the substrate temperature is increased to 600° C. and then kept at this temperature for one minute. Thereafter, supplies of Al and Ga are started to carry out a third molecular beam epitaxial growth of the undoped $Al_{0.24}Ga_{0.76}As$ spacer layer 34 on the undoped $In_{0.15}Ga_{0.85}As$ channel layer 33. The Si-doped $Al_{0.24}Ga_{0.76}As$ spacer layer 34. The Si-doped GaAs cap layer 36 is further grown on the Si-doped $Al_{0.24}Ga_{0.76}As$ electron donor layer 35.

FIG. 2 is a timing chart of conventional switching operations of individual source shutters of a molecular beam epitaxial growth system during a discontinuation of the molecular beam epitaxial growth, while a substrate temperature is increased from 500° C. to 600° C., after the undoped $In_{0.15}Ga_{0.85}As$ channel layer has been grown and before the undoped $Al_{0.24}Ga_{0.76}As$ spacer layer will be grown. During the molecular beam epitaxial growth of the undoped $In_{0.15}Ga_{0.85}As$ channel layer 33, an As shutter, a Ga shutter and an In shutter remain opened to supply As, Ga and In whilst an Al shutter remains closed not to supply Al. Immediately after the molecular beam epitaxial growth of the undoped $In_{0.15}Ga_{0.85}As$ channel layer 33 has been completed, then the substrate temperature is increased to 600° C., during which the Ga shutter and the In shutter are closed to discontinue the supplies of Ga and In, whilst the Al shutter remains closed and the As shutter remains opened to further continue the supply of As. Further, for one minute after the substrate temperature is increased to 600° C., the above states of the shutters remain unchanged. Subsequently, the As shutter remains opened and the Ga shutter and Al shutter are switched to open so as to supply Ga, Al and As, whilst the In shutter remains closed, whereby the undoped $Al_{0.24}Ga_{0.76}As$ spacer layer 34 are grown on the undoped $In_{0.15}Ga_{0.85}As$ channel layer 33. Characteristics of the epitaxial wafer are evaluated by a secondary ion mass spectrometry. FIG. 3 is a diagram illustrative of depth profiles of atomic fractions of Ga, Al, In, and C as an impurity in the undoped $Al_{0.24}Ga_{0.76}As$ spacer layer and the undoped $In_{0.15}Ga_{0.85}As$ channel layer as results of the secondary ion mass spectroscopy. In the undoped $Al_{0.24}Ga_{0.76}As$ spacer layer 34, an Al fraction is high whilst an In fraction is low. In the undoped $In_{0.15}Ga_{0.85}As$ channel layer 33, the Al fraction is low whilst the In fraction is high. At the hetero-interface between the undoped $Al_{0.24}Ga_{0.76}As$ spacer layer 34 and the undoped $In_{0.15}Ga_{0.85}As$ channel layer 33, the Al fraction and the In fraction are rapidly varied oppositely. In the meantime, the carbon fraction has a sharp peak at the hetero-interface between the undoped $Al_{0.24}Ga_{0.76}As$ spacer layer 34 and the undoped $In_{0.15}Ga_{0.85}As$ channel layer 33. This shows the fact that a large amount of carbon as an impurity was accumulated on the InGaAs/AlGaAs hetero-interface. Namely, during the discontinuation of the molecular beam epitaxy for the time period of one minute after the substrate temperature has been increased to 600° C., carbon atoms in the growth chamber are accumulated on the surface of the undoped $In_{0.15}Ga_{0.85}As$ channel layer 33 and subsequently the undoped $Al_{0.24}Ga_{0.76}As$ spacer layer 34 are grown on the carbon-accumulated surface of the undoped $In_{0.15}Ga_{0.85}As$ channel layer 33. The presence of carbon atoms as the impurity on the InGaAs/AlGaAs hetero-interface decreases the sheet carrier concentration of the two-dimensional electron gas even if the abruptness of the InGaAs/AlGaAs hetero-interface could be increased to increase the electron mobility of the two-dimensional electron gas. The decrease in the sheet carrier concentration of the two-dimensional electron gas decreases the conductance (gm) whereby the current gain cut-off frequency (fT) is also decreased. For this reason, it is difficult for the above conventional molecular beam epitaxial growth method to increase the current gain cut-off frequency (fT).

In order to avoid the carbon impurity accumulation on the InGaAs/AlGaAs hetero-interface, it is indeed effective to shorten the time period after the substrate temperature has been risen and until the molecular beam epitaxy growth method is re-stared to epitaxially grow the undoped $Al_{0.24}Ga_{0.76}As$ spacer layer 34. In this case, however, it is difficult to realize a sufficient evaporation of excess indium from the surface of the undoped $In_{0.15}Ga_{0.85}As$ channel layer 33. The residual excess indium on the InGaAs/AlGaAs hetero-interface deteriorates the abruptness of the InGaAs/AlGaAs hetero-interface. The deteriorated abruptness of the InGaAs/AlGaAs hetero-interface makes it difficult to improve the electron mobility of the two-dimensional electron gas. This means it difficult to increase the current gain cut-off frequency (fT).

In the above circumstances, it has been required to develop a novel molecular beam epitaxial growth method of growing an InGaAs single crystal layer and an AlGaAs single crystal layer on the InGaAs single crystal layer to form an InGaAs/AlGaAs hetero-interface making the compound semiconductor device free from the above problems.

SUMMARY OF THE INVENTION

Accordingly, it is an object of the present invention to provide a novel molecular beam epitaxial growth method of growing an InGaAs single crystal layer and an AlGaAs single crystal layer on the InGaAs single crystal layer to form an InGaAs/AlGaAs hetero-interface making the compound semiconductor device free from the above problems.

It is a further object of the present invention to provide a novel molecular beam epitaxial growth method of growing an InGaAs single crystal layer and an AlGaAs single crystal layer on the InGaAs single crystal layer to form an InGaAs/AlGaAs hetero-interface having an increased abruptness.

It is a still further object of the present invention to provide a novel molecular beam epitaxial growth method of growing an InGaAs single crystal layer and an AlGaAs single crystal layer on the InGaAs single crystal layer to form an InGaAs/AlGaAs hetero-interface enabling an increased electron mobility of a two-dimensional electron gas.

It is yet a further object of the present invention to provide a novel molecular beam epitaxial growth method of growing an InGaAs single crystal layer and an AlGaAs single crystal layer on the InGaAs single crystal layer to form an InGaAs/AlGaAs hetero-interface free of any substantive accumulation of any impurities such as carbon.

It is a further object of the present invention to provide a novel molecular beam epitaxial growth method of growing an InGaAs single crystal layer and an AlGaAs single crystal layer on the InGaAs single crystal layer to form an InGaAs/AlGaAs hetero-interface allowing a high sheet carrier concentration.

It is still further object of the present invention to provide a novel molecular beam epitaxial growth method of growing an InGaAs single crystal layer and an AlGaAs single crystal layer on the InGaAs single crystal layer to form an InGaAs/AlGaAs hetero-interface allowing an increase in conductance (gm).

It is moreover an object of the present invention to provide a novel molecular beam epitaxial growth method of growing an InGaAs single crystal layer and an AlGaAs single crystal layer on the InGaAs single crystal layer to form an InGaAs/AlGaAs hetero-interface allowing a high current gain cut-off frequency.

It is another object of the present invention to provide a novel method of controlling operations of individual source shutters during a discontinuation of the molecular beam epitaxial growth after an InGaAs single crystal layer has been grown and before an AlGaAs single crystal layer will be grown, free from the above problems.

It is still another object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface having an increased abruptness.

It is yet another object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface enabling an increased electron mobility of a two-dimensional electron gas.

It is further another object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface free of any substantive accumulation of any impurities such as carbon.

It is an additional object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface allowing a high sheet carrier concentration.

It is a still additional object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface allowing an increase in conductance (gm).

It is yet an additional object of the present invention to provide a novel method of controlling operations of individual source shutters during a discontinuation of the molecular beam epitaxial growth after an InGaAs single crystal layer has been grown and before an AlGaAs single crystal layer will be grown, to form an improved InGaAs/AlGaAs hetero-interface allowing a high current gain cut-off frequency.

The present invention provides a method of promoting an evaporation of excess indium from a surface of an indium containing compound semiconductor single crystal layer, during a discontinuation of a molecular beam epitaxial growth, wherein substantial supplies of all elements for the indium containing compound semiconductor single crystal layer remain discontinued, at least until a substrate temperature has been risen up to a predetermined temperature of not less than an indium re-evaporation initiation temperature.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
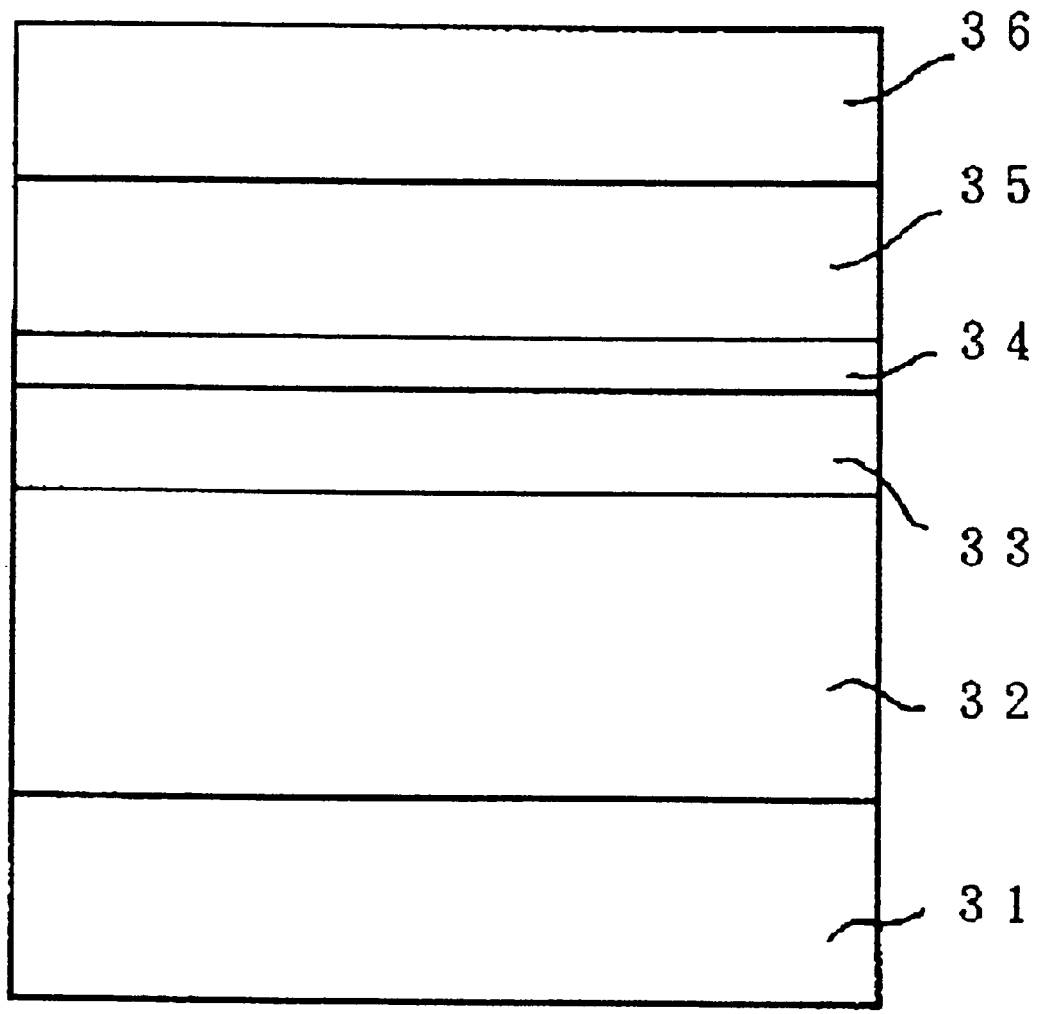
FIG. 1 is a fragmentary cross sectional elevation view illustrative of an epitaxial wafer for a low noise compound semiconductor field effect transistor formed in the conventional molecular beam epitaxial growth method.
Figure 2:
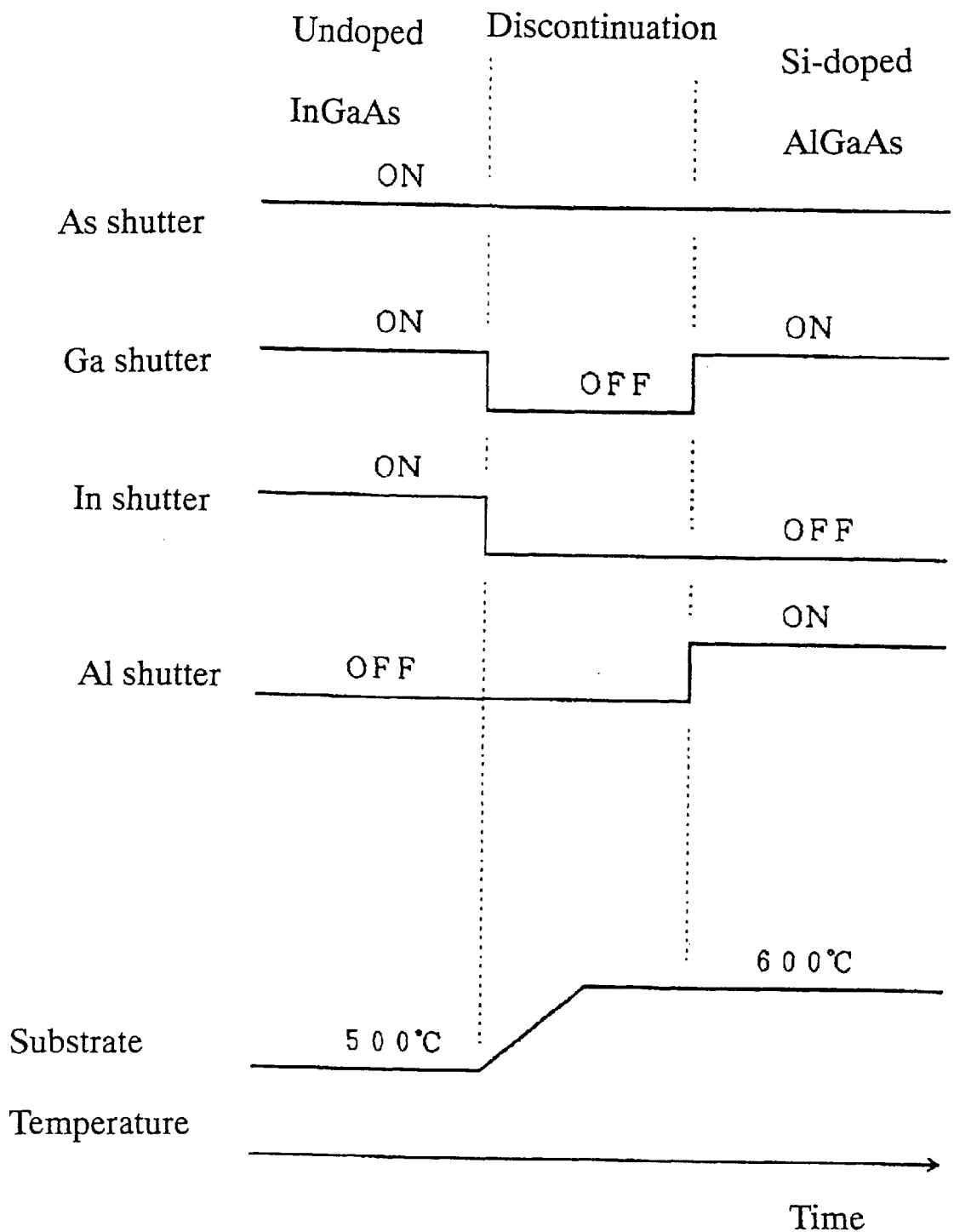
FIG. 2 is a timing chart of the conventional switching operations of individual source shutters of a molecular beam epitaxial growth system during a discontinuation of the molecular beam epitaxial growth after the undoped $In_{0.15}Ga_{0.85}As$ channel layer has been grown and before the undoped $Al_{0.24}Ga_{0.76}As$ spacer layer will be grown.
Figure 3:
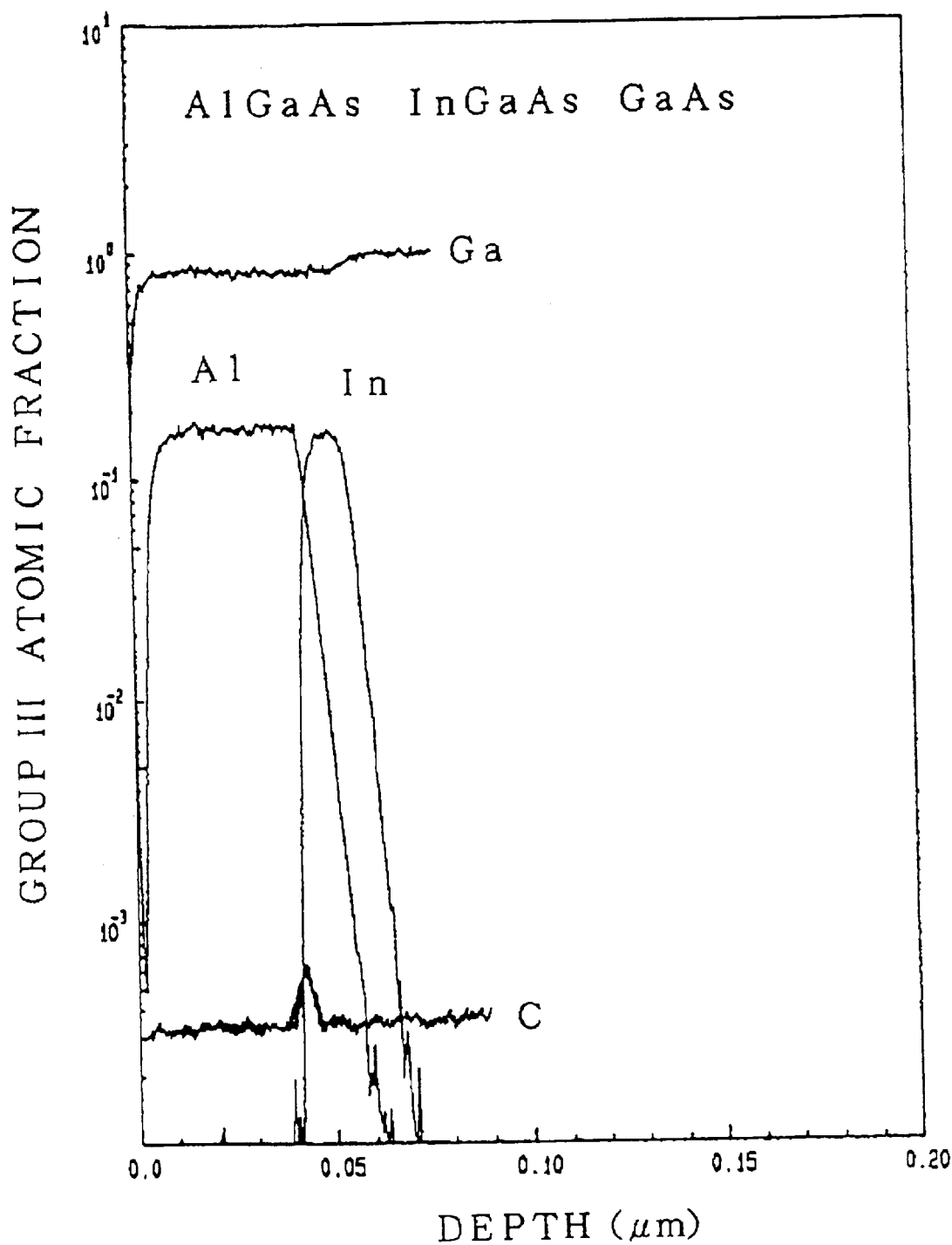
FIG. 3 is a diagram illustrative of depth profiles of atomic fractions of Ga, Al, In, and C as an impurity in the undoped $Al_{0.24}Ga_{0.76}As$ spacer layer and the undoped $In_{0.15}Ga_{0.85}As$ channel layer as results of the secondary ion mass spectroscopy.

The first aspect of the present invention provides a method of promoting an evaporation of excess indium from a surface of an indium containing compound semiconductor single crystal layer, during a discontinuation of a molecular beam epitaxial growth, wherein substantial supplies of all elements for the indium containing compound semiconductor single crystal layer remain discontinued, at least until a substrate temperature rises to a predetermined temperature of not less than an indium re-evaporation initiation temperature.

The discontinuation of the substantive supplies of the all source elements for the indium containing compound semiconductor single crystal layer promotes evaporation of excess indium from the surface of the indium containing compound semiconductor single crystal layer after the substrate temperature has risen to a predetermined temperature of not less than the indium re-evaporation initiation temperature. Namely, no supply of the individual source elements allows the excess indium to be evaporated by merely eliminating the excess indium from the single crystal stricture in the surface region of the indium containing compound semiconductor single crystal layer, whereby an evaporation rate is risen. This allows the sufficient evaporation of the excess indium in a shortened time. Further, even no source elements are supplied to a growth chamber, the chamber keeps a source element poor atmosphere which prevents an evaporation of the other source element than indium from the single crystal structure and also prevents a crystal imperfection due to the evaporation. The sufficient evaporation of the excess indium in the shortened time shortens the time duration of the discontinuation of the molecular beam epitaxy growth, resulting in a reduction in an amount of an accumulated impurity such as carbon on the surface of the indium containing compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) increases.

The discontinuation of the substantial supply of the source elements means to include not only when no source elements are supplied to the growth chamber but also when sufficiently small amounts of source elements are supplied for providing no substantial influence to the evaporation of the excess indium nor substantial growth of the elements on the surface of the indium containing compound semiconductor single crystal layer.

The above first aspect is applicable to the improvement in the hetero-interface between the indium containing group III–V compound semiconductor single crystal layer and another semiconductor crystal layer grown thereon, wherein a group V element may, for example, be As, P and Sb.

In this case, there is provided a novel method of promoting an evaporation of excess indium from a surface of an indium containing group III–V compound semiconductor single crystal layer, during a discontinuation of a molecular beam epitaxial growth, wherein substantial supplies of all source elements including indium as the group III element and As, P or Sb as the group V element remain discontinued, at least until a substrate temperature has been risen up to a predetermined temperature of not less than an indium re-evaporation initiation temperature.

The discontinuation of the substantive supplies of the all source elements including indium as the group III element and the group V element, for example, As, P or Sb results in a promotion of an evaporation of an excess indium from the surface of the indium containing group III–V compound semiconductor single crystal after the substrate temperature has been risen up to a predetermined temperature of not less than the indium re-evaporation initiation temperature. Particularly, no supply of the group V element allows the excess indium to be evaporated by merely eliminating the excess indium from the single crystal stricture in the surface region of the indium containing group III–V compound semiconductor single crystal layer, whereby an evaporation rate is risen. This allows the sufficient evaporation of the excess indium in a shortened time. Further, even no group V element is supplied to the growth chamber, the chamber keeps a group V element poor atmosphere which prevents an evaporation of the group V element from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing group III–V compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the group V element means to include not only when no group V element is supplied to the growth chamber but also when a sufficiently small amount of the group V element is supplied for providing no substantial influence to the evaporation of the excess indium nor substantial growth of the group V element on the surface of the indium containing group III–V compound semiconductor single crystal layer.

The above novel method is applicable to any cases where any semiconductor single crystal layers are grown on the improved surface of the indium containing compound semiconductor single crystal layer.

The above novel method is applicable to cases where the indium containing compound semiconductor single crystal layer may, for example, comprise an InGaAs single crystal layer, an InAlAs single crystal layer, an InGaAsP single crystal layer, an InP single crystal layer, an InAs single crystal layer, or an InSb single crystal layer or any other indium containing compound semiconductors.

The second aspect of the present invention provides a method of operating source element shutters including an indium shutter of a molecular beam epitaxial growth system during a discontinuation of a molecular beam epitaxial growth of an indium containing compound semiconductor single crystal layer, wherein substantial supplies of all elements including indium for the indium containing compound semiconductor single crystal layer remain discontinued, at least until a substrate temperature has been risen up to a predetermined temperature of not less than an indium re-evaporation initiation temperature, so as to promote an evaporation of excess indium from a surface of the indium containing compound semiconductor single crystal layer without any excess accumulation of an impurity on the surface thereof.

The discontinuation of the substantive supplies of the all source elements for the indium containing compound semiconductor single crystal layer results in a promotion of an evaporation of an excess indium from the surface of the indium containing compound semiconductor single crystal layer after the substrate temperature has been risen up to a predetermined temperature of not less than the indium re-evaporation initiation temperature. Namely, no supply of the individual source elements allows the excess indium to be evaporated by merely eliminating the excess indium from the single crystal stricture in the surface region of the indium containing compound semiconductor single crystal layer, whereby an evaporation rate is risen. This allows the sufficient evaporation of the excess indium in a shortened time. Further, even no source elements are supplied to a growth chamber, the chamber keeps a source element poor atmosphere which prevents an evaporation of the other source element than indium from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the source elements means to include not only when no source elements are supplied to the growth chamber but also when sufficiently small amounts of source elements are supplied for providing no substantial influence to the evaporation of the excess indium nor substantial growth of the elements on the surface of the indium containing compound semiconductor single crystal layer.

The above second aspect is applicable to the improvement in the hetero-interface between the indium containing group III–V compound semiconductor single crystal layer and another semiconductor crystal layer grown thereon, wherein a group V element may, for example, be As, P, and Sb.

In this case, there is provided a novel method of promoting an evaporation of excess indium from a surface of an indium containing group III–V compound semiconductor single crystal layer, during a discontinuation of a molecular beam epitaxial growth, wherein substantial supplies of all source elements including indium as the group III element and As, P or Sb as the group V element remain discontinued, at least until a substrate temperature has been risen up to a predetermined temperature of not less than an indium re-evaporation initiation temperature.

The discontinuation of the substantive supplies of the all source elements including indium as the group III element and the group V element, for example, As, P or Sb results in a promotion of an evaporation of an excess indium from the surface of the indium containing group III–V compound semiconductor single crystal layer after the substrate temperature has been risen up to a predetermined temperature of not less than the indium re-evaporation initiation temperature. Particularly, no supply of the group V element allows the excess indium to be evaporated by merely eliminating the excess indium from the single crystal stricture in the surface region of the indium containing group III–V compound semiconductor single crystal layer, whereby an evaporation rate is risen. This allows the sufficient evaporation of the excess indium in a shortened time. Further, even no group V element is supplied to the growth chamber, the chamber keeps a group V element poor atmosphere which prevents an evaporation of the group V element from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing group III–V compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the group V element means to include not only when no group V element is supplied to the growth chamber but also when a sufficiently small amount of the group V element is supplied for providing no substantial influence to the evaporation of the excess indium nor substantial growth of the group V element on the surface of the indium containing group III–V compound semiconductor single crystal layer.

The above novel method is applicable to any cases where any semiconductor single crystal layers are grown on the improved surface of the indium containing compound semiconductor single crystal layer.

The above novel method is applicable to cases where the indium containing compound semiconductor single crystal layer may, for example, comprise an InGaAs single crystal layer, an InAlAs single crystal layer, an InGaAsP single crystal layer, an InP single crystal layer, an InAs single crystal layer, or an InSb single crystal layer or any other indium containing compound semiconductors.

The third aspect of the present invention provides a method of pre-treating a surface of an indium containing compound semiconductor single crystal layer grown by a first molecular beam epitaxy for subsequent growth of a semiconductor single crystal layer by a second molecular beam epitaxy, wherein substantial supplies of all elements including indium for the indium containing compound semiconductor single crystal layer remain discontinued, at least until a substrate temperature has been risen up to a predetermined temperature of not less than an indium re-evaporation initiation temperature, so as to promote an evaporation of excess indium from a surface of the indium containing compound semiconductor single crystal layer without any excess accumulation of an impurity on the surface thereof.

The discontinuation of the substantive supplies of the all source elements for the indium containing compound semiconductor single crystal layer results in a promotion of an evaporation of an excess indium from the surface of the indium containing compound semiconductor single crystal layer after the substrate temperature has been risen up to a predetermined temperature of not less than the indium re-evaporation initiation temperature. Namely, no supply of the individual source elements allows the excess indium to be evaporated by merely eliminating the excess indium from the single crystal stricture in the surface region of the indium containing compound semiconductor single crystal layer, whereby an evaporation rate is risen. This allows the sufficient evaporation of the excess indium in a shortened time. Further, even no source elements are supplied to a growth chamber, the chamber keeps a source element poor atmosphere which prevents an evaporation of the other source element than indium from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the source elements means to include not only when no source elements are supplied to the growth chamber but also when sufficiently small amounts of source elements are supplied for providing no substantial influence to the evaporation of the excess indium nor substantial growth of the elements on the surface of the indium containing compound semiconductor single crystal layer.

The above third aspect is applicable to the improvement in the hetero-interface between the indium containing group III–V compound semiconductor single crystal layer and another semiconductor crystal layer grown thereon, wherein a group V element may, for example, be As, P, and Sb.

In this case, there is provided a novel method of promoting an evaporation of excess indium from a surface of an indium containing group III–V compound semiconductor single crystal layer, during a discontinuation of a molecular beam epitaxial growth, wherein substantial supplies of all source elements including indium as the group III element and As, P or Sb as the group V element remain discontinued, at least until a substrate temperature has been risen up to a predetermined temperature of not less than an indium re-evaporation initiation temperature.

The discontinuation of the substantive supplies of the all source elements including indium as the group III element and the group V element, for example, As, P or Sb results in a promotion of an evaporation of an excess indium from the surface of the indium containing group III–V compound semiconductor single crystal layer after the substrate temperature has been risen up to a predetermined temperature of not less than the indium re-evaporation initiation temperature. Particularly, no supply of the group V element allows the excess indium to be evaporated by merely eliminating the excess indium from the single crystal stricture in the surface region of the indium containing group III–V compound semiconductor single crystal layer, whereby an evaporation rate is risen. This allows the sufficient evaporation of the excess indium in a shortened time. Further, even no group V element is supplied to the growth chamber, the chamber keeps a group V element poor atmosphere which prevents an evaporation of the group V element from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing group III–V compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the group V element means to include not only when no group V element is supplied to the growth chamber but also when a sufficiently small amount of the group V element is supplied for providing no substantial influence to the evaporation of the excess indium nor substantial growth of the group V element on the surface of the indium containing group III–V compound semiconductor single crystal layer.

The above novel method is applicable to any cases where any semiconductor single crystal layers are grown on the improved surface of the indium containing compound semiconductor single crystal layer.

The above novel method is applicable to cases where the indium containing compound semiconductor single crystal layer may, for example, comprise an InGaAs single crystal layer, an InAlAs single crystal layer, an InGaAsP single crystal layer, an InP single crystal layer, an InAs single crystal layer, or an InSb single crystal layer or any other indium containing compound semiconductors.

The fourth aspect of the present invention provides a method of growing an indium containing compound semiconductor single crystal layer and a semiconductor single crystal layer. The method comprises the following steps. A first molecular beam epitaxial growth is carried out for growing the indium containing compound semiconductor single crystal layer. The first molecular beam epitaxial growth is discontinued, wherein substantial supplies of all elements including indium for the indium and arsenic containing compound semiconductor single crystal layer remain discontinued, at least until a substrate temperature has been risen up to a predetermined temperature of not less than an indium re-evaporation initiation temperature, so as to promote an evaporation of excess indium from a surface of the indium and arsenic containing compound semiconductor single crystal layer without any excess accumulation of an impurity on the surface thereof. A second molecular beam epitaxial growth is carried out for growing the semiconductor single crystal layer on the surface of the indium and arsenic containing compound semiconductor single crystal layer.

The discontinuation of the substantive supplies of the all source elements for the indium containing compound semiconductor single crystal layer results in a promotion of an evaporation of an excess indium from the surface of the indium containing compound semiconductor single crystal layer after the substrate temperature has been risen up to a predetermined temperature of not less than the indium re-evaporation initiation temperature. Namely, no supply of the individual source elements allows the excess indium to be evaporated by merely eliminating the excess indium from the single crystal stricture in the surface region of the indium containing compound semiconductor single crystal layer, whereby an evaporation rate is risen. This allows the sufficient evaporation of the excess indium in a shortened time. Further, even no source elements are supplied to a growth chamber, the chamber keeps a source element poor atmosphere which prevents an evaporation of the other source element than indium from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the source elements means to include not only when no source elements are supplied to the growth chamber but also when sufficiently small amounts of source elements are supplied for providing no substantial influence to the evaporation of the excess indium nor substantial growth of the elements on the surface of the indium containing compound semiconductor single crystal layer.

The above fourth aspect is applicable to the improvement in the hetero-interface between the indium containing group III–V compound semiconductor single crystal layer and another semiconductor crystal layer grown thereon, wherein a group V element may, for example, be As, P and Sb.

In this case, there is provided a novel method of promoting an evaporation of excess indium from a surface of an indium containing group III–V compound semiconductor single crystal layer, during a discontinuation of a molecular beam epitaxial growth, wherein substantial supplies of all source elements including indium as the group III element and As, P or Sb as the group V element remain discontinued, at least until a substrate temperature has been risen up to a predetermined temperature of not less than an indium re-evaporation initiation temperature.

The discontinuation of the substantive supplies of the all source elements including indium as the group III element and the group V element, for example, As, P or Sb results in a promotion of an evaporation of an excess indium from the surface of the indium containing group III–V compound semiconductor single crystal after the substrate temperature has been risen up to a predetermined temperature of not less than the indium re-evaporation initiation temperature. Particularly, no supply of the group V element allows the excess indium to be evaporated by merely eliminating the excess indium from the single crystal stricture in the surface region of the indium containing group III–V compound semiconductor single crystal layer, whereby an evaporation rate is risen. This allows the sufficient evaporation of the excess indium in a shortened time. Further, even no group V element is supplied to the growth chamber, the chamber keeps a group V element poor atmosphere which prevents an evaporation of the group V element from the single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the indium containing group III–V compound semiconductor single crystal layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the indium containing compound semiconductor single crystal layer allows forming a highly abrupt hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of the group V element means to include not only when no group V element is supplied to the growth chamber but also when a sufficiently small amount of the group V element is supplied for providing no substantial influence to the evaporation of the excess indium nor substantial growth of the group V element on the surface of the indium containing group III–V compound semiconductor single crystal layer.

The above novel method is applicable to any cases where any semiconductor single crystal layers are grown on the improved surface of the indium containing compound semiconductor single crystal layer.

The above novel method is applicable to cases where the indium containing compound semiconductor single crystal layer may, for example, comprise an InGaAs single crystal layer, an InAlAs single crystal layer, an InGaAsP single crystal layer, an InP single crystal layer, an InAs single crystal layer, or an InSb single crystal layer or any other indium containing compound semiconductors.

The fifth aspect of the present invention provides a molecular beam epitaxial growth method of growing a plurality of GaAs-based compound semiconductor single crystal layers over a GaAs substrate. The method comprises the following steps. An undoped GaAs buffer layer is grown on the GaAs substrate at a substrate temperature in the range of 600° C. to 630° C. An undoped InGaAs channel layer is grown on the undoped GaAs buffer layer at a substrate temperature in the range of 480° C. to 530° C. Substantial supplies of In, Ga and As are discontinued and concurrently the substrate temperature is increased up to in the range of 600° C. to 630° C. so as to evaporate an excess indium from a surface of the undoped InGaAs channel layer. The molecular beam epitaxial growth is re-initiated by substantial supplies of Si, Ga, Al and As so as to grow an Si-doped AlGaAs electron donor layer on the undoped InGaAs channel layer.

It is possible to further grow an Si-doped GaAs cap layer on the Si-doped AlGaAs electron donor layer.

It is preferable to further carry out a pre-treatment of cleaning a surface of the GaAs substrate for subsequent molecular beam epitaxial growth.

The discontinuation of the substantive supplies of In, Ga and As results in a promotion of an evaporation of an excess indium from the surface of the undoped InGaAs channel layer, during which the substrate temperature is risen up to a predetermined temperature in the range of 600° C. to 630° C. This allows the sufficient evaporation of the excess indium in a shortened time. Further, even no arsenic is supplied to the growth chamber, the chamber keeps an arsenic poor atmosphere which prevents an evaporation of As from the InGaAs single crystal structure and also prevents a crystal imperfection due to the evaporation. The sufficient evaporation of the excess indium in the shortened time enables to shorten the time duration of the discontinuation of the molecular beam epitaxy growth, resulting in a reduction in an amount of an accumulated impurity such as carbon on the surface of the undoped InGaAs channel layer during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the undoped InGaAs channel layer allows forming a highly abrupt InGaAs/AlGaAs hetero-interface, whereby an electron mobility of the two-dimensional electron gas is increased. The increases in the sheet carrier concentration and the electron mobility of the two-dimensional electron gas increases the conductance (gm), whereby the current gain cut-off frequency (fT) is risen.

The discontinuation of the substantial supply of arsenic means to include not only when no arsenic is supplied to the growth chamber but also when a sufficiently small amount of arsenic is supplied for providing no substantial influence to the evaporation of the excess indium nor substantial growth of arsenic on the surface of the undoped InGaAs channel layer.

PREFERRED EMBODIMENTS

Figure 4:
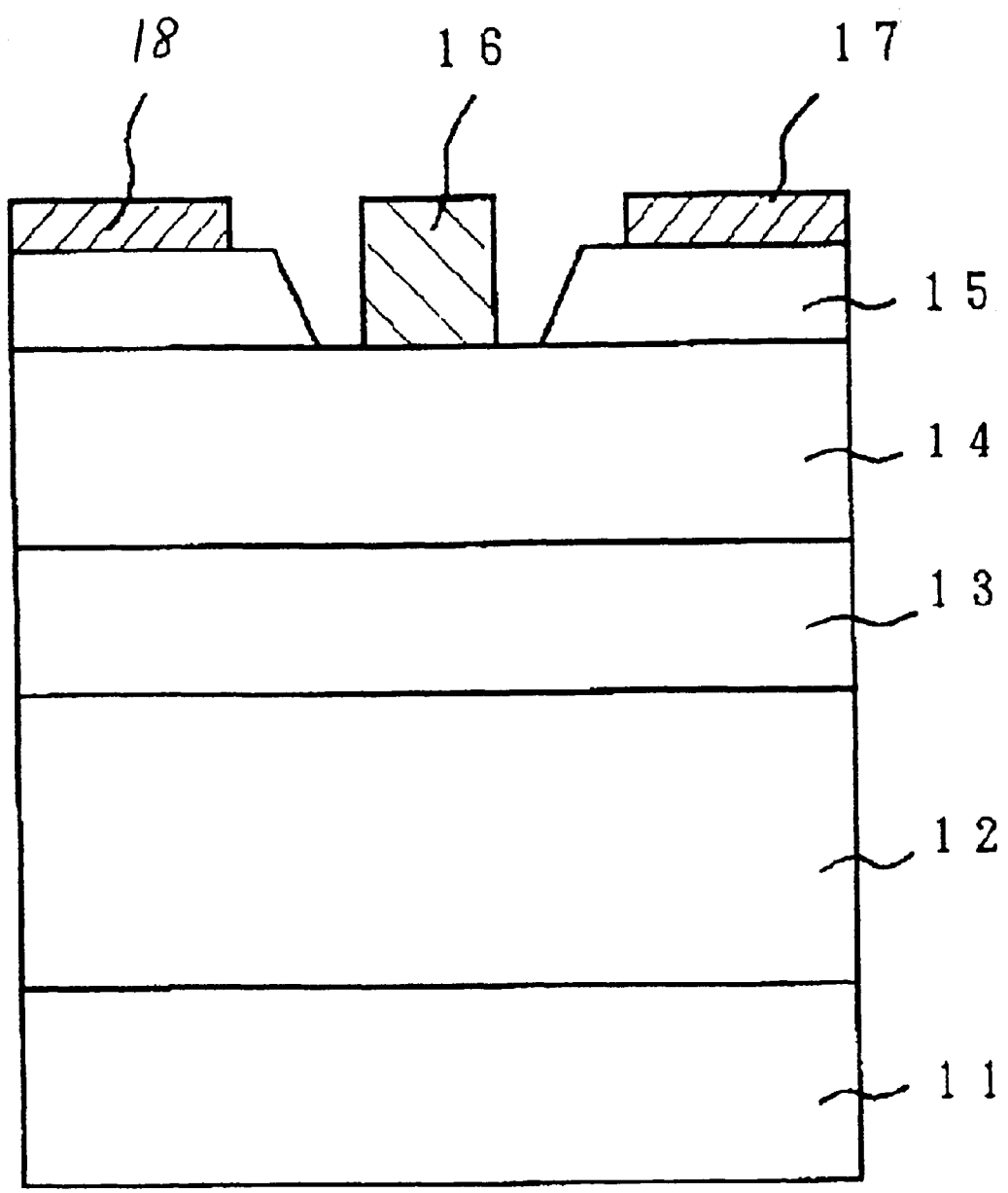
FIG. 4 is a fragmentary cross sectional elevation view illustrative of a low noise Schottky gate GaAs-based compound semiconductor field effect transistor formed in a novel molecular beam epitaxial growth method in a first embodiment in accordance with the present invention.

First Embodiment:

A first embodiment according to the present invention will be described in detail with reference to FIG. 4 which is a fragmentary cross sectional elevation view illustrative of a low noise Schottky gate GaAs-based compound semiconductor field effect transistor formed in a novel molecular beam epitaxial growth method. The low noise Schottky gate GaAs-based compound semiconductor field effect transistor comprises a GaAs substrate 11, an undoped GaAs buffer layer 12 on the GaAs substrate 11, an undoped $In_{0.15}Ga_{0.85}As$ channel layer 13 on the undoped GaAs buffer layer 12, an Si-doped $Al_{0.2}Ga_{0.8}As$ electron donor layer 14 on the undoped $In_{0.15}Ga_{0.85}As$ channel layer 13, and an Si-doped GaAs cap layer 15 on the Si-doped $Al_{0.2}Ga_{0.8}As$ electron donor layer 14. The Si-doped GaAs cap layer 15 has a recessed portion through which a surface of the Si-doped $Al_{0.2}Ga_{0.8}As$ electron donor layer 14 is shown. Drain and source electrodes 17 and 18 are provided on the Si-doped GaAs cap layer 15. A Schottky gate electrode 16 is provided on the Si-doped $Al_{0.2}Ga_{0.8}As$ electron donor layer 14 in the recessed portion of the Si-doped GaAs cap layer 15. The above low noise Schottky gate GaAs-based compound semiconductor field effect transistor may be formed as follows.

A surface of the GaAs substrate 11 is subjected to a cleaning process at a temperature of 630° C. for 10 minutes for subsequent molecular beam epitaxial growth processes. The undoped GaAs buffer layer 12 having a thickness of 0.5 micrometers is grown on the GaAs substrate 11 by a first molecular beam epitaxial growth at a substrate temperature of 600° C. The substrate temperature is dropped to 500° C. for a second molecular beam epitaxial growth of the undoped $In_{0.15}Ga_{0.85}As$ channel layer 13 having a thickness of 15 nanometers on the undoped GaAs buffer layer 12. Thereafter, the supplies of not only In and Ga but also As are discontinued, during which the substrate temperature is increased to 600° C.

The discontinuation of the supplies of not only In and Ga but also As results in a promotion of an evaporation of an excess indium from the surface of the undoped $In_{0.15}Ga_{0.85}As$ channel layer 13, during which the substrate temperature is risen up to the predetermined temperature of 600° C. This causes a sufficient evaporation of the excess indium at a high evaporation rate in a shortened time period from the surface of the undoped $In_{0.15}Ga_{0.85}As$ channel layer 13 during the increase in the substrate temperature. Namely, no supply of arsenic allows the excess indium to be evaporated from the surface of the undoped $In_{0.15}Ga_{0.85}As$ channel layer 13 by mere elimination of the excess indium from bonding with arsenic. This promotion of the evaporation of the excess indium from the surface of the undoped $In_{0.15}Ga_{0.85}As$ channel layer 13 rises an evaporation rate thereby shortening the necessary time for the sufficient evaporation of the excess indium, for example, 45 seconds during the rising of the substrate temperature. No holding time for holding the substrate temperature at the predetermined high temperature for subsequent molecular beam epitaxial growth is needed. For this reason, the above novel molecular beam epitaxial growth method remarkably shortens the necessary time for the sufficient evaporation of the excess indium to be much shorter by one minute or more than that needed by the conventional molecular beam epitaxial growth method. Further, in accordance with the novel molecular beam epitaxial growth method, no arsenic is supplied to the growth chamber during the discontinuation of the molecular beam epitaxial growth, so that the chamber keeps an arsenic poor atmosphere which prevents an evaporation of arsenic from the indium gallium arsenide single crystal structure and also prevents a crystal imperfection due to the evaporation.

Immediately after the substrate temperature has been risen up to the predetermined temperature of 600° C., then supplies of not only Al and Ga but also As are started to carry out a third molecular beam epitaxial growth of the Si-doped $Al_{0.2}Ga_{0.8}As$ electron donor layer 14 on the undoped $In_{0.15}Ga_{0.85}As$ channel layer 13. The Si-doped $Al_{0.2}Ga_{0.8}As$ electron donor layer 14 has an Si-doping concentration of $Nd=2E18$ $cm^{-3}$. The Si-doped GaAs cap layer 15 is further grown on the Si-doped $Al_{0.2}Ga_{0.8}As$ electron donor layer 14. The Si-doped GaAs cap layer 15 has an Si-doping concentration of $Nd=3E18$ $cm^{-3}$. Drain and source electrodes 17 and 18 are selectively formed on the Si-doped GaAs cap layer 15. A recess is formed in a center region of the Si-doped GaAs cap layer 15 so that a center region of the Si-doped $Al_{0.2}Ga_{0.8}As$ electron donor layer 14 is shown through the recessed portion. A Schottky gate electrode 16 is further provided on the shown surface of the Si-doped $Al_{0.2}Ga_{0.8}As$ electron donor layer 14 and in the recessed portion of the Si-doped GaAs cap layer 15, thereby completing the required low noise Schottky gate GaAs-based compound semiconductor field effect transistor.

Figure 5:
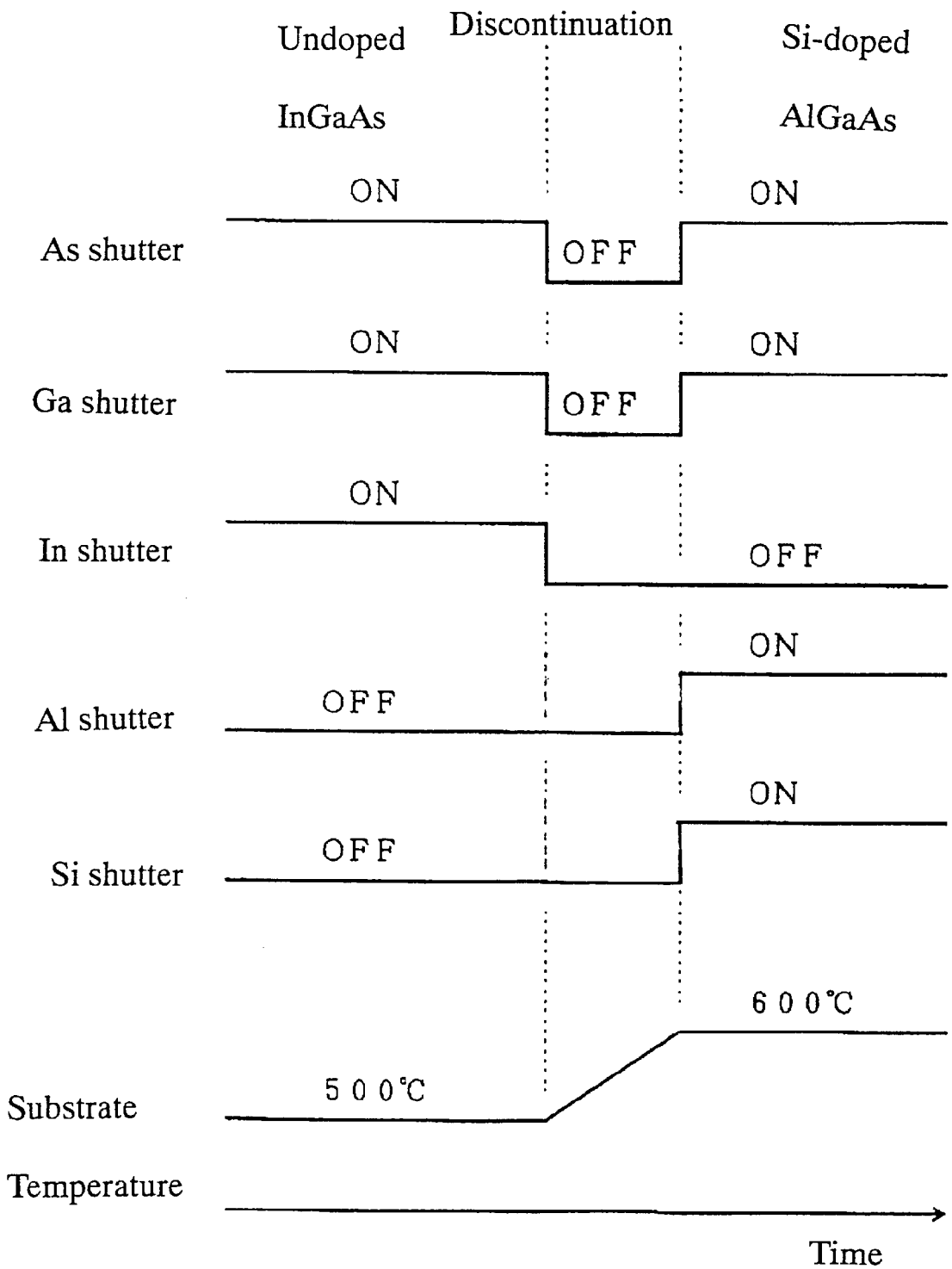
FIG. 5 is a timing chart of novel switching operations of individual source shutters of a molecular beam epitaxial growth system during a discontinuation of the molecular beam epitaxial growth after the undoped $In_{0.15}Ga_{0.85}As$ channel layer has been grown and before the undoped $Al_{0.2}Ga_{0.8}As$ electron donor layer will be grown in a first embodiment in accordance with the present invention.

FIG. 5 is a timing chart of novel switching operations of individual source shutters of a molecular beam epitaxial growth system during a discontinuation of the molecular beam epitaxial growth after the undoped $In_{0.15}Ga_{0.85}As$ channel layer 13 has been grown and before the Si-doped $Al_{0.2}Ga_{0.8}As$ electron donor layer 14 will be grown, while a substrate temperature is increased from 500° C. to 600° C. During the molecular beam epitaxial growth of the undoped $In_{0.15}Ga_{0.85}As$ channel layer 13 at 500° C., an As shutter, a Ga shutter and an In shutter remain opened to supply As, Ga and In, whilst an Al shutter and an Si shutter remain closed not to supply Al and Si. Immediately after the molecular beam epitaxial growth of the undoped $In_{0.15}Ga_{0.85}As$ channel layer 13 has been completed, then the substrate temperature is increased to 600° C., during which not only the Ga shutter and the In shutter but also the As shutter are closed to discontinue the supplies of Ga, In and As, whilst the Al shutter and the Si shutter remain closed. At the same time when the substrate temperature becomes 600° C., the As shutter, the Ga shutter, Al shutter and the Si shutter are switched to open so as to supply As, Ga, Al and Si, whilst the In shutter remains closed, whereby the Si-doped $Al_{0.2}Ga_{0.8}As$ electron donor layer 14 are grown on the undoped $In_{0.15}Ga_{0.85}As$ channel layer 13. The time duration of the discontinuation of the molecular beam epitaxial growth is about 45 seconds which is much shorter by one minute or more than the time duration of the discontinuation of the conventional molecular beam epitaxial growth.

Figure 6:
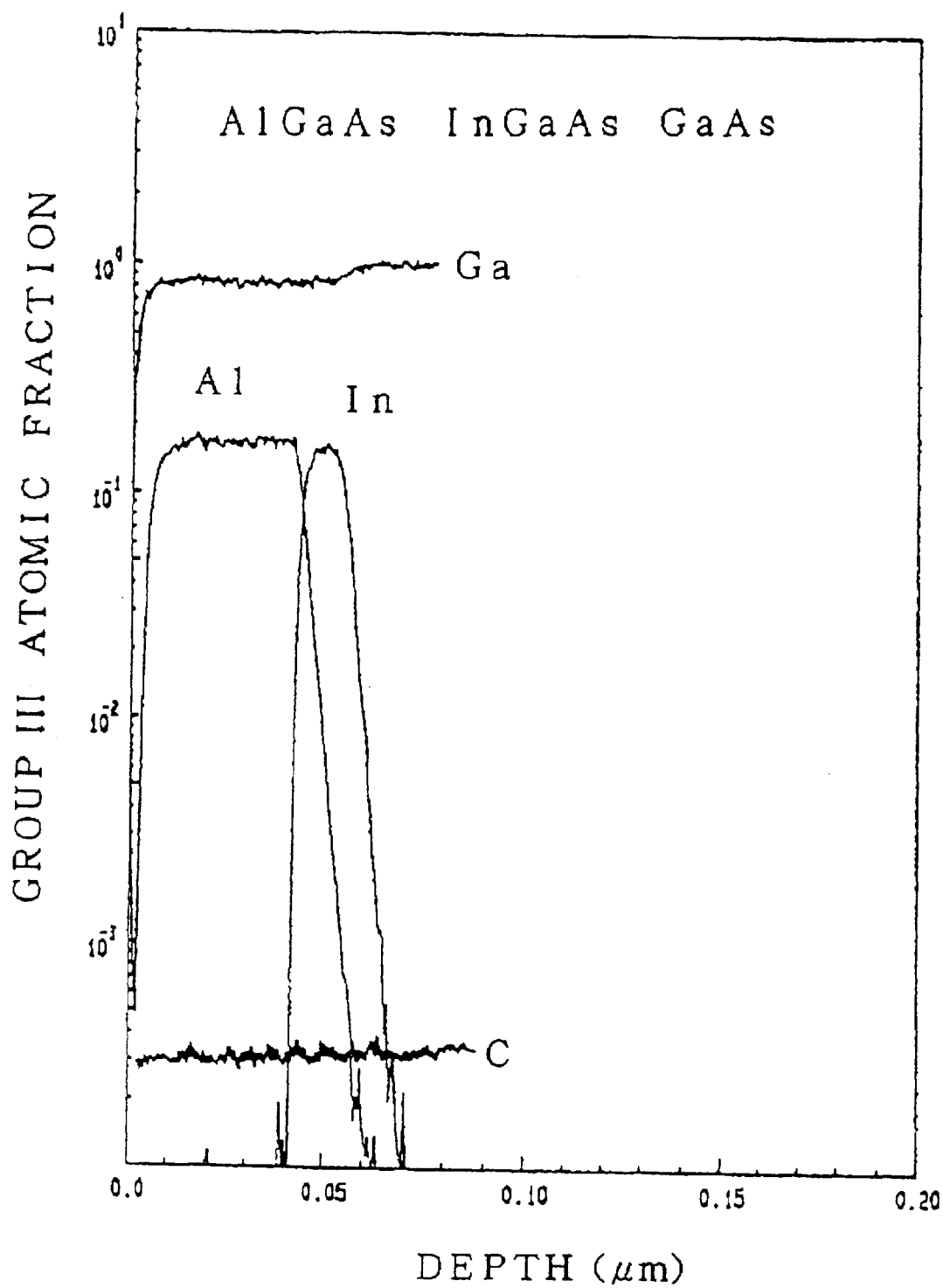
FIG. 6 is a diagram illustrative of depth profiles of atomic fractions of Ga, Al, In, and C as an impurity in the undoped $Al_{0.2}Ga_{0.8}As$ electron donor layer and the undoped $In_{0.15}Ga_{0.85}As$ channel layer as results of the secondary ion mass spectroscopy in a first embodiment in accordance with the present invention.

Characteristics of the low noise Schottky gate GaAs-based compound semiconductor field effect transistor are evaluated by a secondary ion mass spectrometry. FIG. 6 is a diagram illustrative of depth profiles of atomic fractions of Ga, Al, In, and C as an impurity in the Si-doped $Al_{0.2}Ga_{0.8}As$ electron donor layer 14 and the undoped $In_{0.15}Ga_{0.85}As$ channel layer 13 as results of the secondary ion mass spectroscopy. In the Si-doped $Al_{0.2}Ga_{0.8}As$ electron donor layer 14, an Al fraction is high whilst an In fraction is low. In the undoped $In_{0.15}Ga_{0.85}As$ channel layer 13, the Al fraction is low whilst the In fraction is high. At the heterointerface between the Si-doped $Al_{0.2}Ga_{0.8}As$ electron donor layer 14 and the undoped $In_{0.15}Ga_{0.85}As$ channel layer 13, the Al fraction and the In fraction are rapidly varied oppositely. In the meantime, the carbon fraction has no peak between the Si-doped $Al_{0.2}Ga_{0.8}As$ electron donor layer 14 and the undoped $In_{0.15}Ga_{0.85}As$ channel layer 13. This shows the fact that a very small amount of carbon as an impurity was accumulated on the InGaAs/AlGaAs heterointerface. Namely, during the discontinuation of the molecular beam epitaxy for the time period of one minute after the substrate temperature has been increased to 600° C., even carbon atoms in the growth chamber are accumulated on the surface of the undoped $In_{0.15}Ga_{0.85}As$ channel layer 13 but in the shortened time period, for example, 45 seconds, for which reason a very small amount of carbon was accumulated on the surface of the undoped $In_{0.15}Ga_{0.85}As$ channel layer 13. Subsequently, the Si-doped $Al_{0.2}Ga_{0.8}As$ electron donor layer 14 is grown on the surface of the undoped $In_{0.15}Ga_{0.85}As$ channel layer 13. The sufficient evaporation of the excess indium in the shortened time enables to shorten the time duration of the discontinuation of the molecular beam epitaxy growth, resulting in a reduction in an amount of the accumulated impurity such as carbon on the surface of the undoped $In_{0.15}Ga_{0.85}As$ channel layer 13 during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the undoped $In_{0.15}Ga_{0.85}As$ channel layer 13 in the shortened time period allows forming a highly abrupt InGaAs/AlGaAs hetero-interface, whereby an electron mobility of the two-dimensional electron gas is increased. The increases in both the sheet carrier concentration and the electron mobility of the two-dimensional electron gas increases the conductance (gm), whereby the current gain cut-off frequency (fT) is risen.

Figure 7:
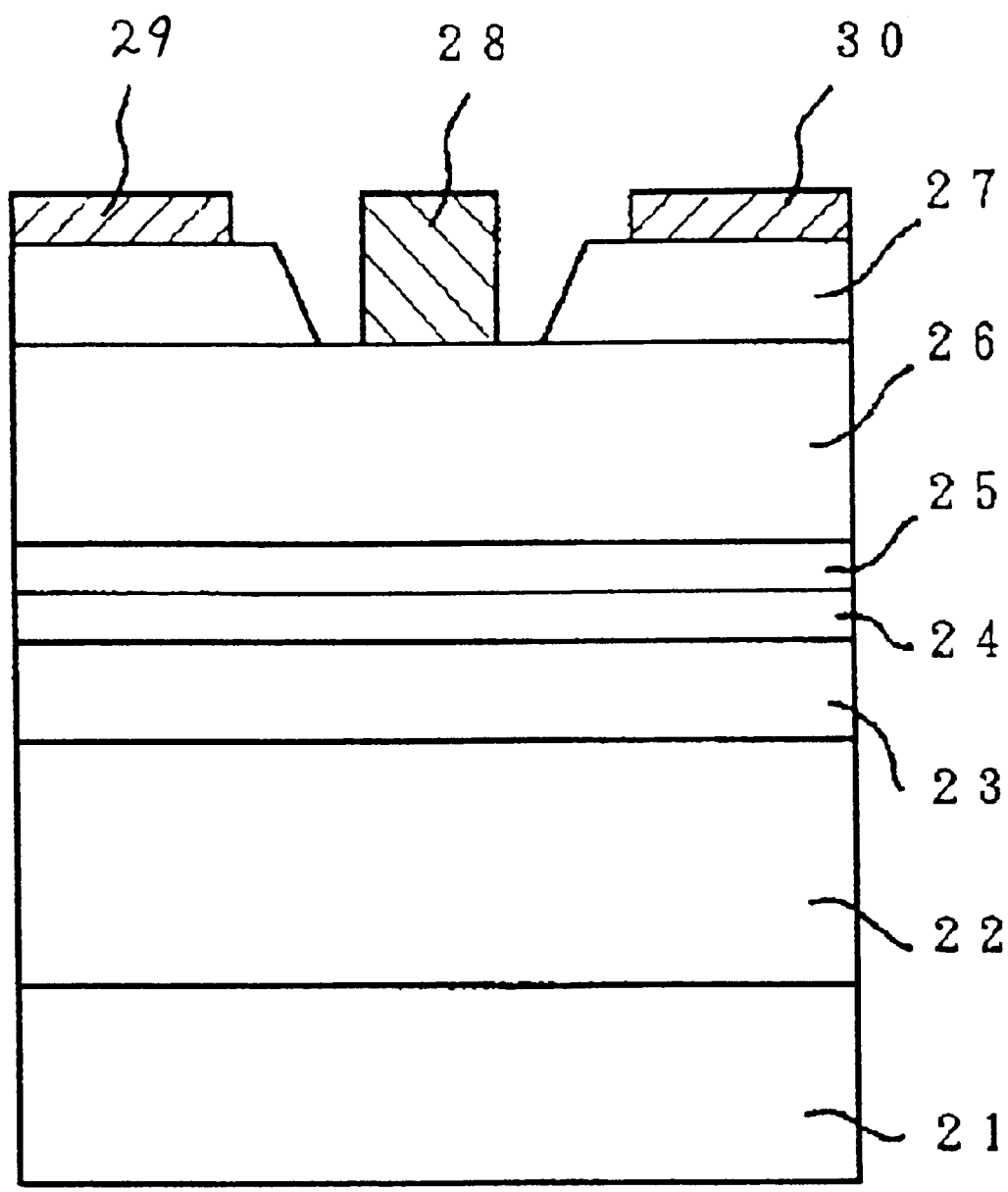
FIG. 7 is a fragmentary cross sectional elevation view illustrative of a low noise Schottky gate GaAs-based compound semiconductor field effect transistor formed in a novel molecular beam epitaxial growth method in a second embodiment in accordance with the present invention.

Second Embodiment:

A second embodiment according to the present invention will be described in detail with reference to FIG. 7 which is a fragmentary cross sectional elevation view illustrative of a low noise Schottky gate GaAs-based compound semiconductor field effect transistor formed in a novel molecular beam epitaxial growth method. The low noise Schottky gate GaAs-based compound semiconductor field effect transistor comprises a GaAs substrate 21, an undoped GaAs buffer layer 22 on the GaAs substrate 21, an undoped $In_{0.15}Ga_{0.85}As$ channel layer 23 on the undoped GaAs buffer layer 22, an undoped $Al_{0.2}Ga_{0.8}As$ spacer layer 24 on the undoped $In_{0.15}Ga_{0.85}As$ channel layer 23, an Si-planer doping layer 25 on the undoped $In_{0.15}Ga_{0.85}As$ channel layer 23, an undoped $Al_{0.2}Ga_{0.8}As$ barrier layer 26 on the Si-planer doping layer 25 and an Si-doped GaAs cap layer 15 on the undoped $Al_{0.2}Ga_{0.8}As$ barrier layer 26. The Si-doped GaAs cap layer 27 has a recessed portion through which a surface of the undoped $Al_{0.2}Ga_{0.8}As$ barrier layer 26 is shown. Source and drain electrodes 29 and 30 are provided on the Si-doped GaAs cap layer 27. A Schottky gate electrode 28 is provided on the undoped $Al_{0.2}Ga_{0.8}As$ electron barrier layer 26 and in the recessed portion of the Si-doped GaAs cap layer 27. The above low noise Schottky gate GaAs-based compound semiconductor field effect transistor may be formed as follows.

A surface of the GaAs substrate 21 is subjected to a cleaning process at a temperature of 630° C. for 10 minutes for subsequent molecular beam epitaxial growth processes. The undoped GaAs buffer layer 12 having a thickness of 0.5 micrometers is grown on the GaAs substrate 21 by a first molecular beam epitaxial growth at a substrate temperature of 600° C. The substrate temperature is dropped to 500° C. for a second molecular beam epitaxial growth of the undoped $In_{0.15}Ga_{0.85}As$ channel layer 23 having a thickness of 10 nanometers on the undoped GaAs buffer layer 22. Thereafter, the supplies of not only In and Ga but also As are discontinued, during which the substrate temperature is increased to 600° C.

The discontinuation of the supplies of not only Al and Ga but also As results in a promotion of an evaporation of an excess indium from the surface of the undoped $In_{0.15}Ga_{0.85}As$ channel layer 23, during which the substrate temperature is risen up to the predetermined temperature of 600° C. This causes a sufficient evaporation of the excess indium at a high evaporation rate in a shortened time period, for example, 45 seconds from the surface of the undoped $In_{0.15}Ga_{0.85}As$ channel layer 23 during the increase in the substrate temperature. Namely, no supply of arsenic allows the excess indium to be evaporated from the surface of the undoped $In_{0.15}Ga_{0.85}As$ channel layer 23 by mere elimination of the excess indium from bonding with arsenic. This promotion of the evaporation of the excess indium from the surface of the undoped $In_{0.15}Ga_{0.85}As$ channel layer 23 rises an evaporation rate thereby shortening the necessary time for the sufficient evaporation of the excess indium, for example, 45 seconds during the rising of the substrate temperature. No holding time for holding the substrate temperature at the predetermined high temperature for subsequent molecular beam epitaxial growth is needed. For this reason, the above novel molecular beam epitaxial growth method remarkably shortens the necessary time for the sufficient evaporation of the excess indium to be much shorter by one minute or more than that needed by the conventional molecular beam epitaxial growth method. Further, in accordance with the novel molecular beam epitaxial growth method, no arsenic is supplied to the growth chamber during the discontinuation of the molecular beam epitaxial growth, so that the chamber keeps an arsenic poor atmosphere which prevents an evaporation of arsenic from the indium gallium arsenide single crystal structure and also prevents a crystal imperfection due to the evaporation.

Immediately after the substrate temperature has been risen up to the predetermined temperature of 600° C., then supplies of not only Al and Ga but also As are started to carry out a third molecular beam epitaxial growth of the undoped $Al_{0.2}Ga_{0.8}As$ spacer layer 24 on the undoped $In_{0.15}Ga_{0.85}As$ channel layer 23. During an initial time period of the epitaxial growth of the undoped $Al_{0.2}Ga_{0.8}As$ spacer layer 24, the substrate temperature is reduced to 550° C. and subsequently the epitaxial growth is continued at 550° C. until the epitaxial growth of the undoped $Al_{0.2}Ga_{0.8}As$ spacer layer 24 having a thickness of 5 nanometers is completed. Subsequently, an Si-planar doping is carried out at a dose of $5E18 cm^{-2}$ so as to form an Si-planar doping layer 25 on the undoped $Al_{0.2}Ga_{0.8}As$ spacer layer 24. An undoped $Al_{0.2}Ga_{0.8}As$ barrier layer 26 having a thickness of 30 nanometers is grown on the Si-planar doping layer 25. A Si-doped GaAs cap layer 15 having a thickness of 0.1 micrometer is further grown on the undoped $Al_{0.2}Ga_{0.8}As$ barrier layer 26. The Si-doped GaAs cap layer 27 has an Si-doping concentration of $Nd=3E18 cm^{-3}$. Source and drain electrodes 29 and 30 are selectively formed on the Si-doped GaAs cap layer 27. A recess is formed in a center region of the Si-doped GaAs cap layer 27 so that a center region of the undoped $Al_{0.2}Ga_{0.8}As$ barrier layer 26 is shown through the recessed portion. A Schottky gate electrode 28 is further provided on the shown surface of the undoped $Al_{0.2}Ga_{0.8}As$ barrier layer 26 and in the recessed portion of the Si-doped GaAs cap layer 27, thereby completing the required low noise Schottky gate GaAs-based compound semiconductor field effect transistor.

Figure 8:
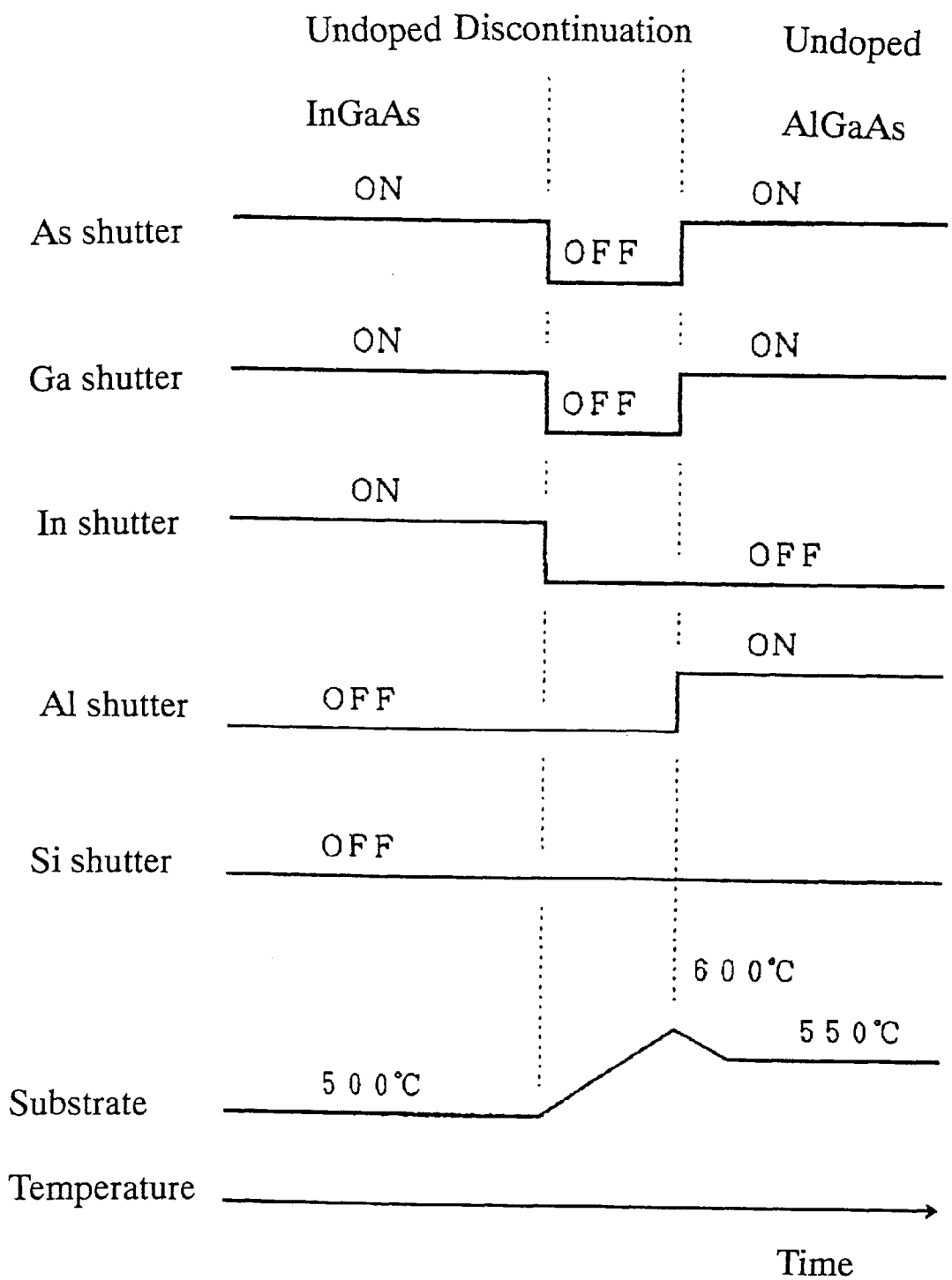
FIG. 8 is a timing chart of novel switching operations of individual source shutters of a molecular beam epitaxial growth system during a discontinuation of the molecular beam epitaxial growth after the undoped $In_{0.2}Ga_{0.8}As$ channel layer has been grown and before the undoped $Al_{0.2}Ga_{0.8}As$ spacer layer will be grown in a second embodiment in accordance with the present invention.

FIG. 8 is a timing chart of novel switching operations of individual source shutters of a molecular beam epitaxial growth system during a discontinuation of the molecular beam epitaxial growth after the undoped $In_{0.15}Ga_{0.85}As$ channel layer 23 has been grown and before the undoped $Al_{0.2}Ga_{0.8}As$ spacer layer 24 will be grown, while a substrate temperature is increased from 500° C. to 600° C. During the molecular beam epitaxial growth of the undoped $In_{0.15}Ga_{0.85}As$ channel layer 23 at 500° C., an As shutter, a Ga shutter and an In shutter remain opened to supply As, Ga and In, whilst an Al shutter and an Si shutter remain closed not to supply Al and Si. Immediately after the molecular beam epitaxial growth of the undoped $In_{0.15}Ga_{0.85}As$ channel layer 23 has been completed, then the substrate temperature is increased to 600° C., during which not only the Ga shutter and the In shutter but also the As shutter are closed to discontinue the supplies of Ga, In and As, whilst the Al shutter and the Si shutter remain closed. At the same time when the substrate temperature becomes 600° C., the As shutter, the Ga shutter and Al shutter are switched to open so as to supply As, Ga, and Al, whilst the In shutter and the Si shutter remain closed, whereby the undoped $Al_{0.2}Ga_{0.8}As$ spacer layer 24 are grown on the undoped $In_{0.15}Ga_{0.85}As$ channel layer 23, during which the substrate temperature is decreased from 600° C. to 550° C. The time duration T1–T2 of the discontinuation of the molecular beam epitaxial growth is about 45 seconds which is much shorter by one minute or more than the time duration of the discontinuation of the conventional molecular beam epitaxial growth.

Figure 9:
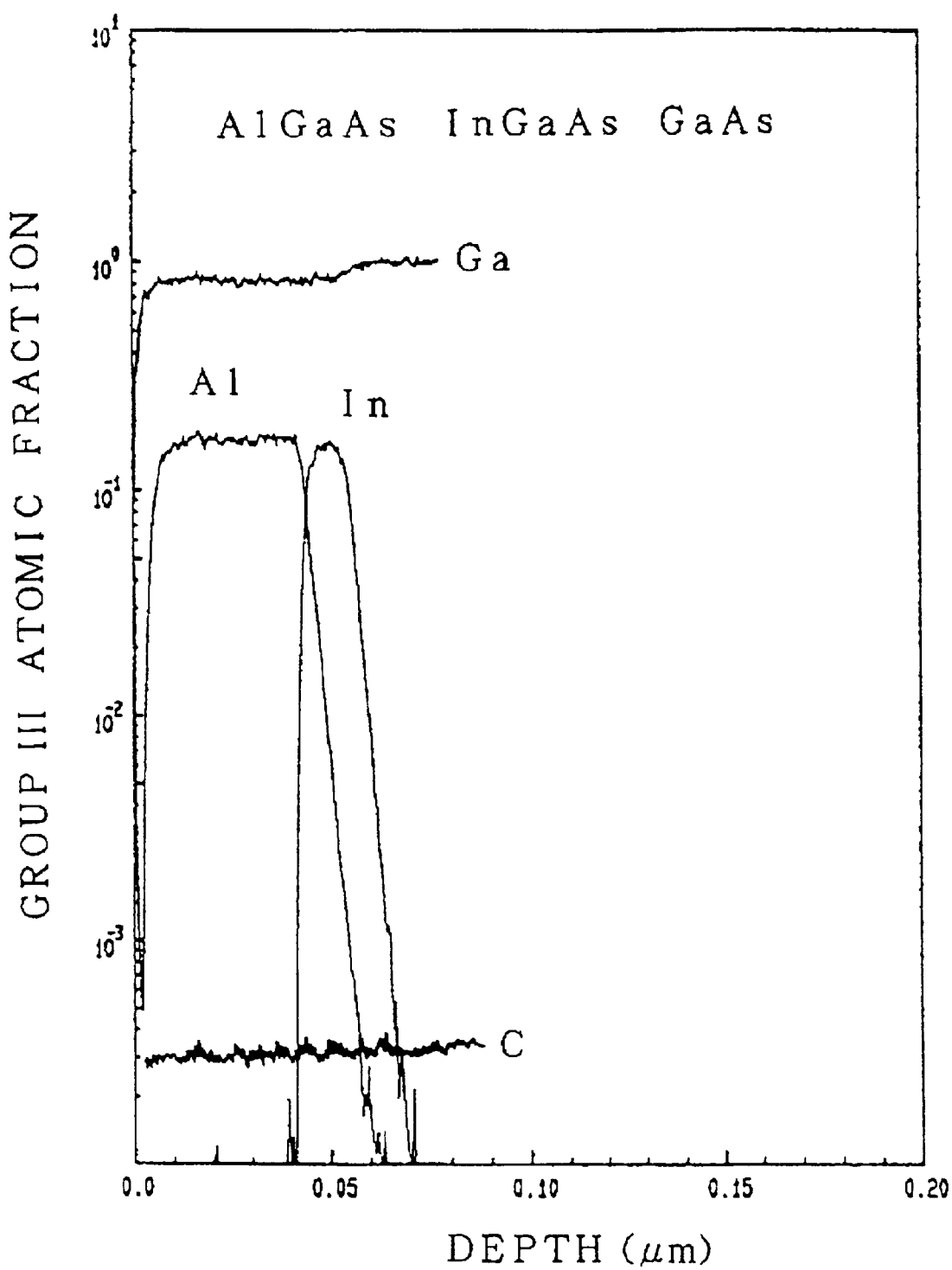
FIG. 9 is a diagram illustrative of depth profiles of atomic fractions of Ga, Al, In, and C as an impurity in the undoped $Al_{0.2}Ga_{0.8}As$ spacer layer and the undoped $In_{0.2}Ga_{0.8}As$ channel layer as results of the secondary ion mass spectroscopy in a second embodiment in accordance with the present invention.

Characteristics of the low noise Schottky gate GaAs-based compound semiconductor field effect transistor are evaluated by a secondary ion mass spectrometry. FIG. 9 is a diagram illustrative of depth profiles of atomic fractions of Ga, Al, In, and C as an impurity in the undoped $Al_{0.2}Ga_{0.8}As$ spacer layer 24 and the undoped $In_{0.15}Ga_{0.85}As$ channel layer 23 as results of the secondary ion mass spectroscopy. In the undoped $Al_{0.2}Ga_{0.8}As$ spacer layer 24, an Al fraction is high whilst an In fraction is low. In the undoped $In_{0.15}Ga_{0.85}As$ channel layer 23, the Al fraction is low whilst the In fraction is high. At the hetero-interface between the undoped $Al_{0.2}Ga_{0.8}As$ spacer layer 24 and the undoped $In_{0.15}Ga_{0.85}As$ channel layer 23, the Al fraction and the In fraction are rapidly varied oppositely. In the meantime, the carbon fraction has no peak between the undoped $Al_{0.2}Ga_{0.8}As$ spacer layer 24 and the undoped $In_{0.15}Ga_{0.85}As$ channel layer 23. This shows the fact that a very small amount of carbon as an impurity was accumulated on the InGaAs/AlGaAs hetero-interface. Namely, during the discontinuation of the molecular beam epitaxy for the time period of one minute after the substrate temperature has been increased to 600° C., even carbon atoms in the growth chamber are accumulated on the surface of the undoped $In_{0.15}Ga_{0.85}As$ channel layer 23 but in the shortened time period, for example, 45 seconds, for which reason a very small amount of carbon was accumulated on the surface of the undoped $In_{0.15}Ga_{0.85}As$ channel layer 23. Subsequently, the undoped $Al_{0.2}Ga_{0.8}As$ spacer layer 24 is grown on the surface of the undoped $In_{0.15}Ga_{0.85}As$ channel layer 23. The sufficient evaporation of the excess indium in the shortened time enables to shorten the time duration of the discontinuation of the molecular beam epitaxy growth, resulting in a reduction in an amount of the accumulated impurity such as carbon on the surface of the undoped $In_{0.15}Ga_{0.85}As$ channel layer 23 during the discontinuation of the molecular beam epitaxy growth. The reduction in the amount of the accumulated impurity such as carbon allows an increase in the sheet carrier concentration of the two-dimensional electron gas. Further, the sufficient evaporation of the excess indium from the surface of the undoped $In_{0.15}Ga_{0.85}As$ channel layer 23 in the shortened time period allows forming a highly abrupt InGaAs/AlGaAs hetero-interface, whereby an electron mobility of the two-dimensional electron gas is increased. The increases in both the sheet carrier concentration and the electron mobility of the two-dimensional electron gas increases the conductance (gm), whereby the current gain cut-off frequency (fT) is risen.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of promoting evaporation of excess indium from a surface of an indium containing compound semiconductor single crystal layer during a discontinuation of a molecular beam epitaxial growth, comprising the steps of:
   stopping substantial supply of all source elements for said indium containing compound semiconductor single crystal layer at least until a substrate temperature rises to a predetermined temperature of not less than an indium re-evaporation initiation temperature.

2. The method as claimed in claim 1, wherein said indium containing compound semiconductor single crystal layer comprises an indium containing group III–V compound semiconductor single crystal layer.

3. The method as claimed in claim 2, wherein said indium containing group III–V compound semiconductor single crystal layer comprises an InGaAs single crystal layer.

4. The method as claimed in claim 2, wherein said indium containing group III–V compound semiconductor single crystal layer comprises an InAlAs single crystal layer.

5. The method as claimed in claim 2, wherein said indium containing group III–V compound semiconductor single crystal layer comprises an InGaAsP single crystal layer.

6. The method as claimed in claim 2, wherein said indium containing group III–V compound semiconductor single crystal layer comprises an InP single crystal layer.

7. The method as claimed in claim 2, wherein said indium containing group III–V compound semiconductor single crystal layer comprises an InAs single crystal layer.

8. The method as claimed in claim 2, wherein said indium containing group III–V compound semiconductor single crystal layer comprises an InSb single crystal layer.

9. The method as claimed in claim 1, wherein said indium re-evaporation initiation temperature is in the range of 600° C. to 630° C.

10. The method as claimed in claim 1, wherein supplies of source elements are started for a molecular beam epitaxial growth of a semiconductor single crystal layer on said surface of said indium containing compound semiconductor single crystal layer, at the same time when said substrate temperature is risen up to said predetermined temperature.

11. A method of operating individual source element shutters of a molecular beam epitaxial growth system during a discontinuation of a molecular beam epitaxial growth of an indium compound semiconductor single crystal layer, comprising the steps of:
   stopping substantial supply of all source elements for said indium containing compound semiconductor single crystal layer at least until a substrate temperature rises to a predetermined temperature of not less than an indium re-evaporation initiation temperature, so as to promote an evaporation of excess indium from a surface of said indium containing compound semiconductor single crystal layer without any excess accumulation of an impurity on said surface thereof.

12. The method as claimed in claim 11, wherein said indium containing compound semiconductor single crystal layer comprises an indium containing group III–V compound semiconductor single crystal layer.

13. The method as claimed in claim 12, wherein said indium containing group III–V compound semiconductor single crystal layer comprises an InGaAs single crystal layer.

14. The method as claimed in claim 12, wherein said indium containing group III–V compound semiconductor single crystal layer comprises an InAlAs single crystal layer.

15. The method as claimed in claim 12, wherein said indium containing group III–V compound semiconductor single crystal layer comprises an InGaAsP single crystal layer.

16. The method as claimed in claim 12, wherein said indium containing group III–V compound semiconductor single crystal layer comprises an InP single crystal layer.

17. The method as claimed in claim 12, wherein said indium containing group III–V compound semiconductor single crystal layer comprises an InAs single crystal layer.

18. The method as claimed in claim 12, wherein said indium containing group III–V compound semiconductor single crystal layer comprises an InSb single crystal layer.

19. The method as claimed in claim 11, wherein said indium re-evaporation initiation temperature is in the range of 600° C. to 630° C.

20. The method as claimed in claim 11, wherein supplies of source elements are started for a molecular beam epitaxial growth of a semiconductor single crystal layer on said surface of said indium containing compound semiconductor single crystal layer, at the same time when said substrate temperature is risen up to said predetermined temperature.

21. A method of pre-treating a surface of an indium containing compound semiconductor single crystal layer grown by a first molecular beam epitaxy for subsequent growth of a semiconductor single crystal layer by a second molecular beam epitaxy, comprising the steps of:

stopping substantial supply of all source elements for said indium containing compound semiconductor single crystal layer at least until a substrate temperature rises to a predetermined temperature of not less than an indium re-evaporation initiation temperature, so as to promote an evaporation of an excess indium from a surface of said indium containing compound semiconductor single crystal layer without any excess accumulation of an impurity on said surface thereof.

22. The method as claimed in claim 21, wherein said indium containing compound semiconductor single crystal layer comprises an indium containing group III–V compound semiconductor single crystal layer.

23. The method as claimed in claim 22, wherein said indium containing group III–V compound semiconductor single crystal layer comprises an InGaAs single crystal layer.

24. The method as claimed in claim 22, wherein said indium containing group III–V compound semiconductor single crystal layer comprises an InAlAs single crystal layer.

25. The method as claimed in claim 22, wherein said indium containing group III–V compound semiconductor single crystal layer comprises an InGaAsP single crystal layer.

26. The method as claimed in claim 22, wherein said indium containing group III–V compound semiconductor single crystal layer comprises an InP single crystal layer.

27. The method as claimed in claim 22, wherein said indium containing group III–V compound semiconductor single crystal layer comprises an InAs single crystal layer.

28. The method as claimed in claim 22, wherein said indium containing group III–V compound semiconductor single crystal layer comprises an InSb single crystal layer.

29. The method as claimed in claim 21, wherein said indium re-evaporation initiation temperature is in the range of 600° C. to 630° C.

30. The method as claimed in claim 21, wherein supplies of source elements are started for a molecular beam epitaxial growth of said semiconductor single crystal layer on said surface of said indium containing compound semiconductor single crystal layer, at the same time when said substrate temperature is risen up to said predetermined temperature.

31. A method of molecular beam epitaxial growths of an indium containing compound semiconductor single crystal layer and a semiconductor single crystal layer, said method comprising the steps of:

carrying out a first molecular beam epitaxial growth for growing said indium containing compound semiconductor single crystal layer;

discontinuing said first molecular beam epitaxial growth, wherein substantial supplies of all source elements for said indium containing compound semiconductor single crystal layer remain discontinued, at least until a substrate temperature rises to a predetermined temperature of not less than an indium re-evaporation initiation temperature, so as to promote an evaporation of an excess indium from a surface of said indium containing compound semiconductor single crystal layer without any excess accumulation of an impurity on said surface thereof; and carrying out a second molecular beam epitaxial growth for growing said semiconductor single crystal layer on said surface of said indium containing compound semiconductor single crystal layer.

32. The method as claimed in claim 31, wherein said indium containing compound semiconductor single crystal layer comprises an indium containing group III–V compound semiconductor single crystal layer.

33. The method as claimed in claim 32, wherein said indium containing group III–V compound semiconductor single crystal layer comprises an InGaAs single crystal layer.

34. The method as claimed in claim 32, wherein said indium containing group III–V compound semiconductor single crystal layer comprises an InAlAs single crystal layer.

35. The method as claimed in claim 32, wherein said indium containing group III–V compound semiconductor single crystal layer comprises an InGaAsP single crystal layer.

36. The method as claimed in claim 32, wherein said indium containing group III–V compound semiconductor single crystal layer comprises an InP single crystal layer.

37. The method as claimed in claim 32, wherein said indium containing group III–V compound semiconductor single crystal layer comprises an InAs single crystal layer.

38. The method as claimed in claim 32, wherein said indium containing group III–V compound semiconductor single crystal layer comprises an InSb single crystal layer.

39. The method as claimed in claim 31, wherein said indium re-evaporation initiation temperature is in the range of 600° C. to 630° C.

40. The method as claimed in claim 31, wherein supplies of source elements are started for a molecular beam epitaxial growth of said semiconductor single crystal layer on said surface of said indium containing compound semiconductor single crystal layer, at the same time when said substrate temperature is risen up to said predetermined temperature.

41. A molecular beam epitaxial growth method of growing a plurality of GaAs-based compound semiconductor single crystal layers over a GaAs substrate, said method comprising the steps of:

growing an undoped GaAs buffer layer on said GaAs substrate at a substrate temperature in the range of 600° C. to 630° C.;

growing an undoped InGaAs channel layer on said undoped GaAs buffer layer at a substrate temperature in the range of 480° C. to 530° C.;

discontinuing substantial supplies of In, Ga and As and concurrently increasing said substrate temperature up to in the range of 600° C. to 630° C. so as to evaporate an excess indium from a surface of said undoped InGaAs channel layer; and re-initiating said molecular beam epitaxial growth by substantial supplies of Si, Ga, Al and As so as to grow an Si-doped AlGaAs electron donor layer on said undoped InGaAs channel layer.

42. The molecular beam epitaxial growth method as claimed in claim 41, further comprising a step of growing an Si-doped GaAs cap layer on said Si-doped AlGaAs electron donor layer.

43. The molecular beam epitaxial growth method as claimed in claim 41, further comprising a step of cleaning a surface of said GaAs substrate for subsequent molecular beam epitaxial growth.

* * * * *